(12) United States Patent
Awata et al.

(10) Patent No.: US 7,871,667 B2
(45) Date of Patent: Jan. 18, 2011

(54) METHOD OF OPERATING VACUUM DEPOSITION APPARATUS AND VACUUM DEPOSITION APPARATUS

(75) Inventors: Hideaki Awata, Itami (JP); Katsuji Emura, Itami (JP); Kentaro Yoshida, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 905 days.

(21) Appl. No.: 11/593,619

(22) Filed: Nov. 7, 2006

(65) Prior Publication Data

US 2007/0110892 A1  May 17, 2007

(30) Foreign Application Priority Data

Nov. 15, 2005  (JP)  ............... 2005/329969

(51) Int. Cl.
*C23C 16/00* (2006.01)
*C23C 16/52* (2006.01)

(52) U.S. Cl. ............... 427/248.1; 427/8; 427/9; 427/10

(58) Field of Classification Search ............... None
See application file for complete search history.

(56) References Cited

U.S. PATENT DOCUMENTS

2002/0043934 A1* 4/2002 Tanaka ............... 313/512
2002/0045007 A1* 4/2002 Arora et al. ............... 427/248.1

FOREIGN PATENT DOCUMENTS

| JP | 6-306856 A | 11/1994 |
| JP | 8-225940 A | 9/1996 |
| JP | 08-287459 | 11/1996 |
| JP | 2002-146518 | 5/2002 |
| JP | 2003-13207 A | 1/2003 |

OTHER PUBLICATIONS

Kazuo (JP08-225940) machine translation, Sep. 1996.*
Nakajima (JP03-13207) machine translation, Jan. 2003.*
Nakajima (JP03-13207), machine translation, Jan. 2003.*
Japanese Office Action, with partial English translation, issued in Japanese Patent Application No. 2005-329969, mailed Aug. 2, 2010.

* cited by examiner

*Primary Examiner*—Timothy H Meeks
*Assistant Examiner*—Joseph Miller, Jr.
(74) *Attorney, Agent, or Firm*—McDermott Will & Emery LLP

(57) ABSTRACT

In a previous experiment of a deposition work of depositing a film with a uniform thickness on a long strip base material in the longitudinal direction thereof, an elapsed time from the start of the deposition work and an output of a power supply at the elapsed time are measured. The resulting relation between the elapsed time and the output is stored in a storage device. Subsequent deposition on a long strip base material is performed by a method in which first, the output of the power supply is controlled to be stabilized at a desired value using a crystal oscillator thickness gauge in a pre-heating step before the start of the deposition work, and then, a base material transport device is driven to start the deposition work on the long strip base material after a desired deposition rate is obtained. After the start of the deposition work, the output of the power supply is controlled to coincide with the output at the elapsed time stored in the storage device.

2 Claims, 4 Drawing Sheets

—□— Internal power input 4.00 kw, Rate of power change 0%/h
—○— Internal power input 4.00 kw, Rate of power change -18%/h

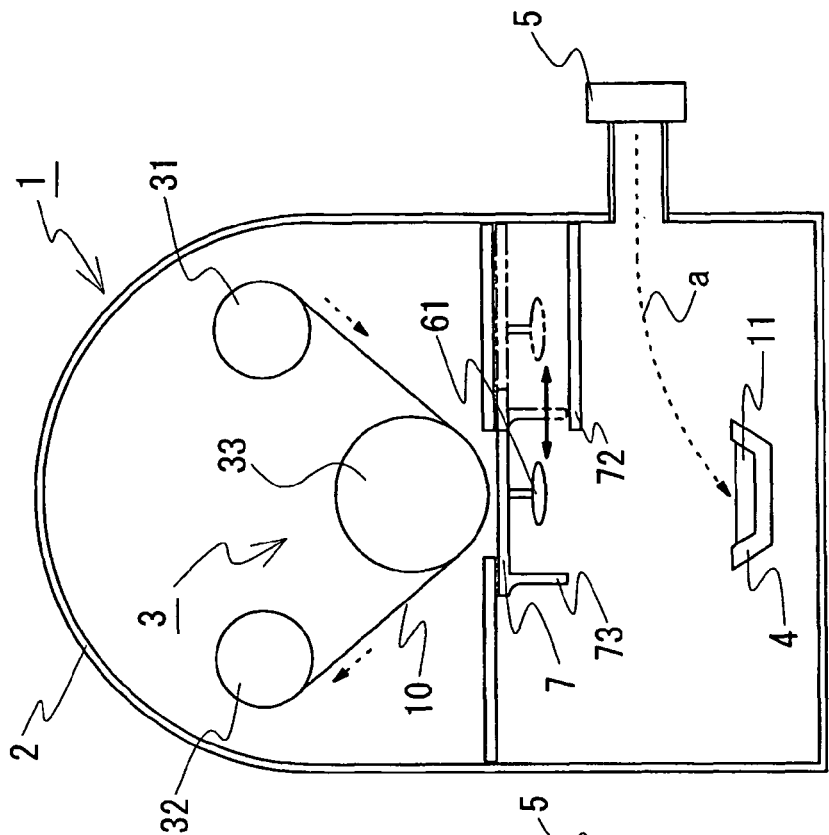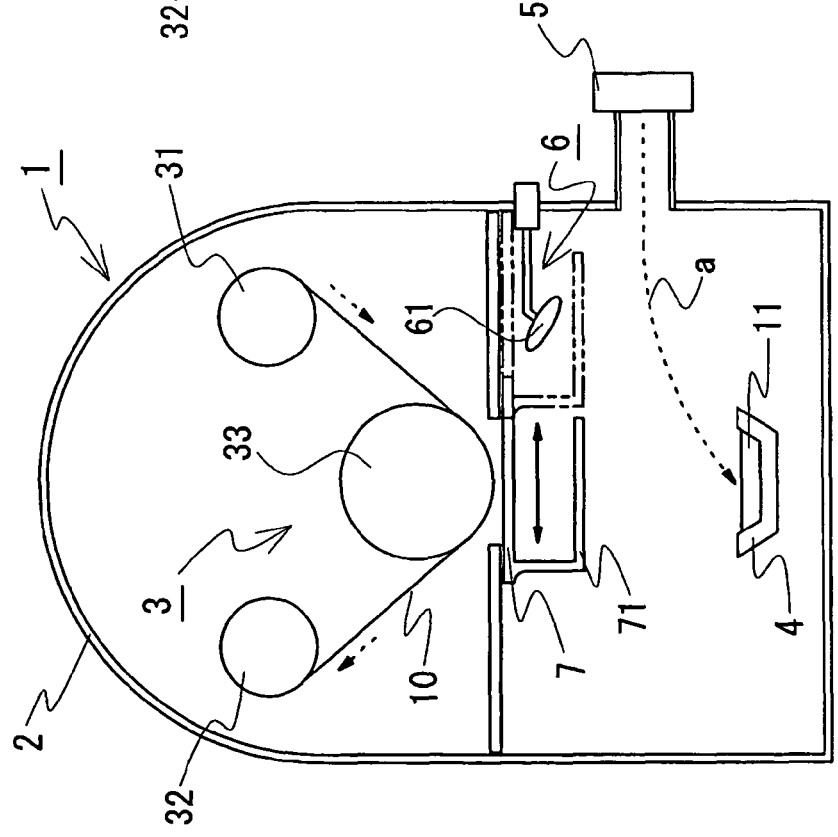

METHOD OF OPERATING VACUUM DEPOSITION APPARATUS AND VACUUM DEPOSITION APPARATUS

BACKGROUND OF THE INVENTION

1. Field of the Invention

The present invention relates to a method of operating a vacuum deposition apparatus in which in a vacuum chamber, an evaporation material is evaporated by heating with a heating device to deposit the evaporation material and form a film on a surface of a long strip base material continuously run by a base material transport device, and also relates to a vacuum deposition apparatus.

2. Description of the Background Art

There has been conventionally used a vacuum deposition apparatus in which in a vacuum chamber, an evaporation material is evaporated by heating with a heating device to deposit the evaporation material and form a film on a surface of a base material. Also, there has been developed a vacuum deposition apparatus for forming a film on a long strip base material, in which in a vacuum chamber, the long strip base material is continuously run by a base material transport device during film deposition. In order to deposit a film on a long strip base material, it is desirable for a deposition apparatus to deposit a film with a uniform thickness in the longitudinal direction of the long strip base material. Therefore, when a film is formed with a uniform thickness in the longitudinal direction of a long strip base material, the amount of deposition is controlled under monitoring of the deposition rate and film thickness. In order to control the amount of deposition, the deposition rate is controlled by adjusting the evaporation rate of an evaporation material with a heating device. The deposition rate may be controlled by adjusting the evaporation conditions such as the degree of vacuum in a vacuum chamber, the transport speed of the base material, and the like.

Methods for monitoring the deposition rate and the film thickness include a method using a crystal oscillator thickness gauge for detecting an amount of deposition from a change in oscillation frequency change of a crystal oscillator or an optical thickness gauge for determining a film thickness by measuring a light transmittance of a base material after the deposition, and a method of theoretically determining a deposition rate by measuring an evaporation rate of an evaporation material using an evaporation rate meter (electron impact type, atomic absorption type, or the like).

Techniques for depositing a film with a uniform thickness on a long strip base material in the longitudinal direction thereof are disclosed in, for example, Japanese Unexamined Patent Application Publication Nos. 6-306586 and 8-225940. Japanese Unexamined Patent Application Publication No. 6-306586 discloses a method of depositing a film with a uniform thickness using an ion plating process. In this method, the amount of deposition is controlled by monitoring the amount of evaporation of an evaporation material by measuring a current flowing through a bias electrode generally disposed in an ion plating deposition apparatus or a current flowing through a Faraday cup disposed in the apparatus. Japanese Unexamined Patent Application Publication No. 8-225940 discloses a vacuum deposition apparatus including an optical thickness gauge provided at a measurement point between the start point and the end point of an evaporation zone. The thickness gauge is adapted for measuring the thickness of a film deposited up to the measurement point to determine the thickness of a film finally deposited on a continuous film-shaped substrate and make the thickness uniform by controlling the amount of deposition.

In addition, as another relevant technique, Japanese Unexamined Patent Application Publication No. 2003-13207 discloses a method of depositing a light-absorbing film having a structure composed of dendritically grown metal crystals, in which a film is deposited at a proper deposition rate without monitoring of the deposition rate and thickness. In this method, the elapsed time from the start of a deposition work and the electric power input to an evaporation boat at the elapsed time are previously measured by an experiment of realizing a high-quality light-absorbing film, and the resulting relation between the elapsed time and electric power input is previously stored in a storage device. In subsequent deposition of a light-absorbing film, the electric power supplied to the evaporation boat is controlled to coincide with the power input at the elapsed time stored in the storage device.

However, any one of the aforementioned techniques has the disadvantage below in depositing a film on a long strip base material under monitoring of the deposition rate and film thickness.

When the deposition rate is monitored with the above-described crystal oscillator thickness gauge, a crystal oscillator sensor is disposed near a base material on which a film is deposited so that a film is deposited on the surface of the crystal oscillator to detect an amount of deposition. However, when the thickness (film weight) of the film deposited on the crystal oscillator is increased to some extent, the crystal oscillator does not oscillate or the deposited film is separated from the crystal oscillator. As a result, a change in oscillation frequency of the crystal oscillator cannot be precisely measured. Therefore, in the case of a high deposition rate, the deposition rate can be monitored for only a short time. For example, in deposition at a deposition rate of 50 μm/sec, the deposition rate can be monitored for only about 5 minutes. In another method, a shutter is provided on a crystal oscillator to intermittently monitor a deposition rate, or the deposition rate is monitored by switching a plurality of crystal oscillators. However, in the case of long-term deposition at a high deposition rate, the former method requires a long interval of monitoring of the deposition rate, thereby failing to precisely control the amount of deposition. The latter method has (1) the problem of requiring a large number of crystal oscillators and (2) the problem of scaling-up an apparatus for holding such a large number of crystal oscillators. Therefore, in order to deposit a film on a long strip base material, monitoring is preferably performed for a long time, and thus the crystal oscillator thickness gauge is not practical.

The method using an optical thickness gauge cannot be used for a base material not having light absorption (for example, a metal such as copper).

In use of an electron impact- or atomic absorption-type evaporation rate meter, generally, a window is provided in a deposition apparatus, and light transmitted through the window is detected by a light receiving part disposed outside the deposition apparatus to measure the evaporation rate of an evaporation material on the basis of the light. In this constitution, the evaporation material does not adhere to the light-receiving part, but the evaporation material adheres to the window because the window is provided at a position facing an evaporation source in the deposition apparatus. Therefore, when the deposition time is increased, the window becomes cloudy due to the adhesion of the evaporation material, thereby causing difficulty in precise measurement.

The method disclosed in Japanese Unexamined Patent Application Publication No. 6-306586 requires evaporation and ionization of an evaporation material. However, with some evaporation materials, not all evaporated particles are ionized, or the ratio of ionization varies. Therefore, there may be no correlation between the evaporation amount of an evaporation material and the current flowing through a bias electrode. Also, this method cannot be used for vacuum deposition not requiring ionization of evaporated particles. For the same reason, the method of measuring a current flowing through a Faraday cup cannot be used.

The vacuum deposition apparatus disclosed in Japanese Unexamined Patent Application Publication No. 8-225940 uses an optical thickness gauge and thus cannot be used for the case in which a base material has no light transmissivity or a base material loses light transmissivity due to film deposition.

The method disclosed in Japanese Unexamined Patent Application Publication No. 2003-13207 is used for deposition at a proper deposition rate in forming a good light-absorbing film having a structure composed of dendritically grown metal crystals. The light-absorbing film is formed on a flake-like substrate disposed on a substrate holder in a deposition apparatus.

Therefore, the method disclosed in Japanese Unexamined Patent Application Publication No. 2003-13207 is completely different from a technique for depositing a film with a uniform thickness on a long strip base material in the longitudinal direction thereof.

SUMMARY OF THE INVENTION

Accordingly, the present invention has been achieved in consideration of the above-mentioned situation, and it is a main object of the present invention to provide a method of operating a vacuum deposition apparatus capable of depositing a film with a uniform thickness on a long strip base material in the longitudinal direction thereof. It is another object of the invention to provide a vacuum deposition apparatus suitable for the operating method.

The present invention relates to a method of operating a vacuum deposition apparatus for depositing a film on a surface of a long strip base material by heat-evaporating an evaporation material using a heating device, the long strip base material being continuously run by a base material transport device.

A vacuum deposition apparatus used in the operating method of the invention includes a detection device capable of monitoring a deposition rate and a film thickness, a control device for controlling a base material transport device and a heating device, and a storage device.

In particular, the operating method of the present invention has the following constitution:

In a preliminary experiment, a film is deposited with a uniform thickness on a long strip base material in the longitudinal direction thereof. In this experiment, the elapsed time from the start point of the deposition work and the output from the heating device at the elapsed time are measured, and the resulting relation between the elapsed time and output is stored in the storage device. Subsequent deposition on a long strip base material is performed as follows: First, in a pre-heating step of stabilizing the deposition rate before the start of a deposition work, the output of the heating device is controlled to achieve a desired deposition rate on the basis of the detection results obtained from the detection device. Next, after the desired deposition rate is attained, the base material transport device is driven to start the deposition work on the long strip base material. After the start of the deposition work, the deposition work is performed by controlling the output of the heating device so that the output coincides with the output at the elapsed time stored in the storage device.

In this case, the detection device is capable of monitoring the deposition rate for only a short time in the pre-heating step so that a film can be deposited with a uniform thickness on the long strip base material in the longitudinal direction thereof.

The detection device of the vacuum deposition apparatus used in carrying out the operating method of the present invention preferably uses a crystal oscillator thickness measuring method which is capable of monitoring the deposition rate and film thickness by detecting a change in oscillation frequency of a crystal oscillator.

The method for measuring a thickness with the crystal oscillator is capable of detecting a deposition amount from a change in oscillation frequency on the basis of the thickness (weight) of a film deposited on the surface of the crystal oscillator. By using such a detection device, the deposition amount can be detected even when the base material for deposition has no light transmissivity or the base material loses light transmissivity due to the deposition of the evaporating material. Such a detection device is capable of detecting a deposition amount even when evaporated particles of the evaporation material are slightly ionized, ionized at various ionization ratios, or not ionized.

Furthermore, the vacuum deposition apparatus used in carrying out the operating method of the present invention preferably includes a shutter which can be advanced into and retracted from the space between the long strip base material and an evaporation source. The operating method of the invention includes driving the base material transport device and positioning the shutter at a retracted position at the start of the deposition work, and then performing the deposition work on the long strip base material. The shutter at the retracted position allows the evaporated particles of the evaporation material to reach the long strip base material. The shutter at the advanced position interrupts the space between the long strip base material and the evaporation source to inhibit the adhesion of the evaporation particles of the evaporation material to the base material.

In this constitution, the shutter is positioned at the advanced position in the pre-heating step before the start of the deposition work so that the evaporated particles of the evaporation material can be inhibited from adhering to the long strip base material. After a desired deposition rate is stably obtained in the pre-heating step, the base material transport device is driven, and the shutter is positioned at the retracted position to start the deposition work on the long strip base material.

The present invention also relates to a vacuum deposition apparatus in which in a vacuum chamber, an evaporation material is evaporated by heating with a heating device to deposit the evaporation material and form a film on a surface of a long strip base material continuously run by a base material transport device.

The apparatus of the invention includes a detection device for monitoring the deposition rate and thickness, a control device for controlling the base material transport device and the heating device, and a storage device. In the storage device, a relation between the time and output is stored, the relation being previously determined by measuring the elapsed time from the start of a deposition work and the output of the heating device at the elapsed time in an experiment of depositing a film with a uniform thickness on a long strip base material in the longitudinal direction thereof.

In particular, the control device includes a first heating control part for controlling the output of the heating device and controlling the drive of the base material transport device, a second heating control part, and a transport control part.

The first heating control part is adapted for controlling the output of the heating device to achieve a desired deposition rate on the basis of the detection result of the detection device in the pre-heating step for stabilizing the deposition rate before the start of the deposition work.

The second heating control part is adapted for controlling the output of the heating device after the start of the deposition work so that so that the output coincides with the output at the elapsed time stored in the storage device.

The transport control part is adapted for controlling the start of the deposition work on the long strip base material by driving the base material transport device after a desired deposition rate is obtained.

In this constitution, the detection device is capable of monitoring the deposition rate for only a short time in the pre-heating step so that a film can be deposited with a uniform thickness on the long strip base material in the longitudinal direction thereof.

The detection device of the apparatus of the invention preferably includes a crystal oscillator thickness gauge which is capable of monitoring the deposition rate and thickness by detecting a change in oscillation frequency of a crystal oscillator.

The crystal oscillator thickness gauge is capable of detecting a deposition amount from a change in oscillation frequency with the thickness (weight) of a film deposited on the surface of the crystal oscillator. By using such a detection device, the deposition amount can be detected even when the base material for deposition has no light transmissivity or the base material loses light transmissivity due to the deposition of the evaporating material. Such a detection device is capable of detecting a deposition amount even when evaporated particles of the evaporation material are slightly ionized, ionized at various ionization ratios, or not ionized.

The vacuum deposition apparatus of the invention preferably further includes a shutter which can be advanced into and retracted from the space between the long strip base material and an evaporation source. The control device preferably includes a shutter control part for controlling the shutter. The shutter control part drives the base material transport device and positions the shutter at the retracted position at the start of the deposition work, and then starts the deposition work on the long strip base material. The shutter at the retracted position allows the evaporated particles of the evaporation material to reach the long strip base material. The shutter at the advanced position interrupts the space between the long strip base material and the evaporation source to inhibit the adhesion of the evaporation particles of the evaporation material to the base material.

In this constitution, the shutter is positioned at the advanced position in the pre-heating step before the start of the deposition work so that the evaporated particles of the evaporation material can be inhibited from adhering to the long strip base material. After a desired deposition rate is stably obtained in the pre-heating step, the base material transport device is driven, and the shutter is positioned at the retracted position to start the deposition work on the long strip base material.

In the operating method and the apparatus of the invention, the deposition rate is monitored for only a short time in the pre-heating step, and thus the time required for the detection device to monitor the deposition rate may be a short time. In addition, during the deposition work, the deposition rate is not monitored and the output of the heating device is controlled so that the output coincides with the output at the elapsed time stored in the storage device which stores the relation between the elapsed time from the start of the deposition work and the output of the heating device previously obtained in the experiment, thereby permitting the deposition of a film with a uniform thickness on the long strip base material in the longitudinal direction thereof.

BRIEF DESCRIPTION OF THE DRAWINGS

FIG. 4A is a schematic view of a vacuum deposition apparatus according to another embodiment of the invention in which a shield is integrally provided on a shutter; and FIG. 4B is a schematic view of a vacuum deposition apparatus according to a further embodiment of the invention in which a crystal oscillator sensor is integrally provided on a shutter, and a shield is provided in the apparatus and on the shutter.

DETAILED DESCRIPTION OF THE INVENTION

An embodiment of the present invention will be described.

(Constitution of Apparatus)

Figure 1:
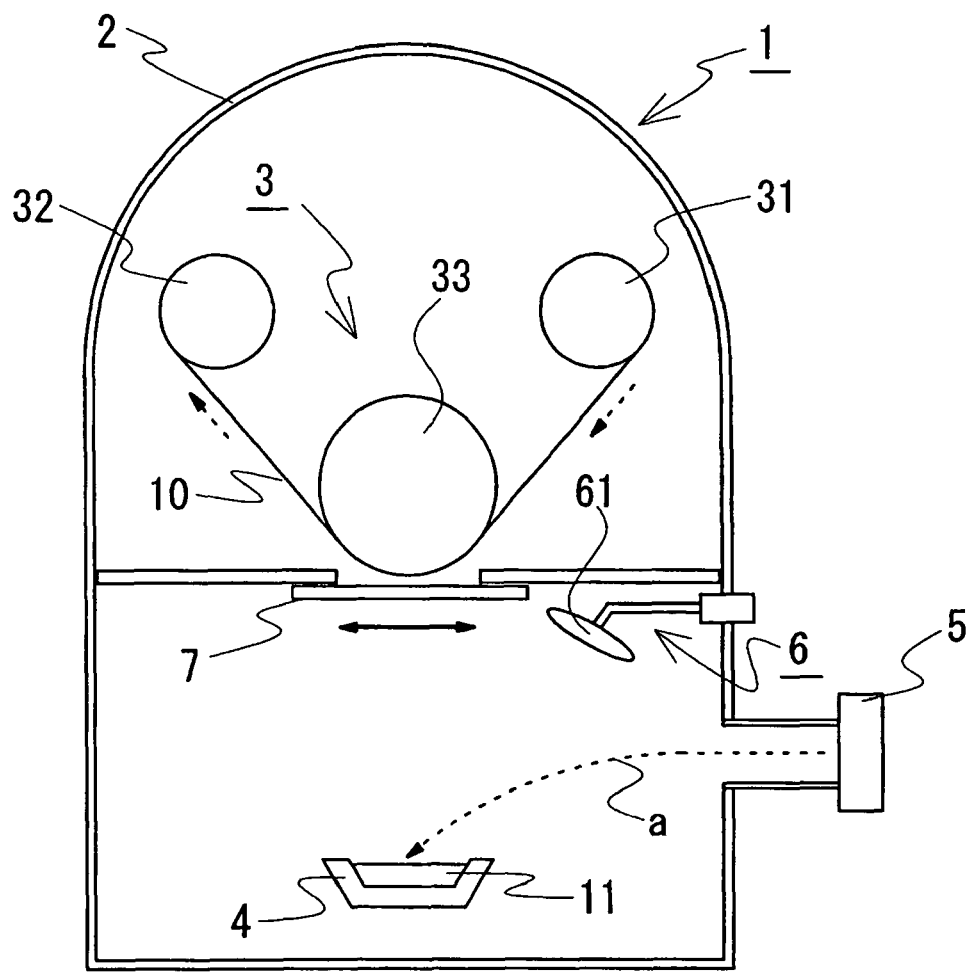
FIG. 1 is a schematic view of a vacuum deposition apparatus according to an embodiment of the present invention.
Figure 2:
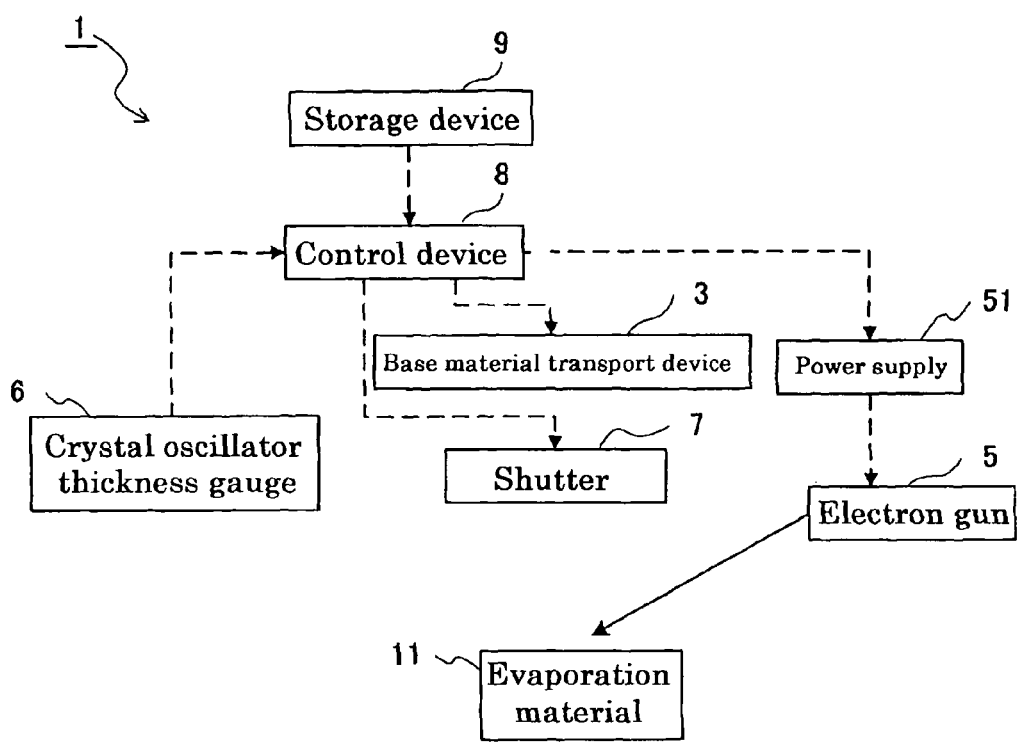
FIG. 2 is a block diagram showing the constitution of a vacuum deposition apparatus according to an embodiment of the invention.

As shown in FIG. 1, a vacuum deposition apparatus of the invention typically includes a vacuum chamber 2, a base material transport device 3, a crucible 4, an electron gun 5, and a crystal oscillator thickness gauge 6. Although not shown in FIG. 1, the vacuum deposition apparatus of the invention further includes a control device 8 and a storage device 9, as shown in a block diagram of FIG. 2.

(Vacuum Chamber)

The vacuum chamber 2 is a member of maintaining a vacuum atmosphere in the apparatus. For example, an exhaust port is provided at each of the top and bottom of the vacuum chamber 2, and the inside is evacuated through the exhaust ports to decrease the pressure, thereby maintaining a vacuum atmosphere.

(Base Material Transport Device)

The base material transport device 3 generally includes a feed roll 31 on which a long strip base material 10 is previously wound, and a take-up roll 32 for the long strip base material 10 after the deposition. These rolls are driven using a motor to continuously run the long strip base material 10.

For example, as shown in FIG. 1, the base material transport device 3 preferably includes the feed roll 31, the take-up roll 32, and a cooling roll 33 disposed at a lower position between two rolls. The feed roll 31 and the take-up roll 32 are driven by the motor, and the cooling roll 33 follows these rolls. The long strip base material 10 is previously wound on the feed roll 31 and is unwound from the feed roll 31 and taken up on the take-up roll 32 while being supported in such a manner that it is push in a downward direction in the figure by the cooling roll 33. The feed roll 31 and the take-up roll 32 are continuously driven to continuously run the long strip base material 10. The cooling roll 33 includes a cooling device (not shown) provided therein, for suppressing deformation of the long strip base material 10 due to a temperature rise. The cooling roll 33 is disposed opposite to the crucible 4. The rotational drive of the feed roll 31 and the take-up roll 32 is controlled by the control device 8.

(Heating Device)

The electron gun 5 is a heating device which generates an electron beam a. In irradiation of an evaporation material 11 with the electron beam a, the energy of the electron beam is mostly converted to heat, and the evaporation material 11 is heated, melted, and further evaporated. The evaporated particles of the evaporation material 11 are deposited on the surface of the long strip base material 10 run around the peripheral surface of the cooling roll 33 to form a film. The energy of the electron beam a is controlled by the output of the electron gun 5. A power supply 51 for the electron gun 5 can be controlled by a signal input from the control device 8. The heating device is not limited to the electron gun 5, and another heating system, for example, resistance heating or high-frequency induction heating, may be used. The heating device is appropriately selected according to the properties of the evaporation material and film quality.

By controlling the output of the heating device, the evaporation amount of the evaporation material 11 can be controlled to control the amount of deposition. For example, when the output of the heating device is controlled by the product (electric power) of the voltage applied to the heating device and the current flowing therethrough, the current may be adjusted at a constant voltage, or the voltage may be adjusted at a constant current. The output control of the heating device will be described in detail below. In use of the electron gun 5, the output is controlled by a DC current (emission current) flowing through a filament at a constant acceleration voltage. In use of resistance heating of an evaporation boat, the output is controlled by the electric power consumed by the boat. In use of high-frequency induction heating, the output is controlled by a high-frequency induced current. Alternatively, the evaporation time of the evaporation material 11 may be adjusted by controlling the transport speed of the long strip base material 10 so that the final thickness is a desired thickness. The transport speed of the long strip base material 10 is controlled by, for example, controlling the rotational drive of the base material transport device 3.

(Evaporation Source, Base Material, Evaporation Material)

The crucible 4 is used as an evaporation source. The evaporation source is a member for holding the evaporation material 11 and evaporating it by heating. As another evaporation source, an evaporation boat or hearth may be used. Examples of the evaporation material 11 include metal materials such as aluminum and gold, and nonmetal materials such as silicon. Examples of the long strip base material 10 on which the evaporation material 11 is deposited include resin films of polyethylene and polypropylene, and metal films of copper. When aluminum is deposited on a resin film, a food bag can be produced. When silicon is deposited on a copper foil, an anode of a lithium battery can be produced.

(Detection Device)

The vacuum deposition apparatus 1 uses the crystal oscillator thickness gauge 6 as the detection device for monitoring the deposition rate. According to the present invention, the deposition rate is monitored for only a short time in the pre-heating step before the start of the deposition work, and thus the time for the detection device to monitor the deposition rate and the thickness may be a short time. For example, at the deposition rate of 100 nm/sec or more, the detection device may be difficult of monitoring of the deposition rate and thickness for 3 minutes or more. The detection device is not limited to the crystal oscillator thickness gauge 6.

For example, like the crystal oscillator thickness gauge 6, the detection device is preferably capable of detecting the amount of deposition in direct deposition. The detection device having such a property is capable of detecting the amount of deposition even when the base material 10 on which a film is formed has no light transmissivity or the base material 10 loses light transmissivity due to the deposition of the evaporation material 11. The detection device can detect the amount of deposition even when evaporated particles of the evaporation material 11 are slightly ionized, ionized at various ratios, or not ionized.

A crystal oscillator sensor 61 of the crystal oscillator thickness gauge 6 is disposed near the peripheral surface of the cooling roll 33 on which the evaporation material 11 is deposited on the long strip base material 10. In the present invention, the crystal oscillator sensor 61 is disposed at an elevation angle of 50° to 60° from the crucible 4 and at a height of 250 mm to 280 mm. The crystal oscillator thickness gauge 6 detects the amount of deposition from a change in oscillation frequency of the crystal oscillator sensor 61 to determine the deposition rate from a change in an amount of deposition per unit time. The deposition rate is informed to the control device 8. The control device 8 feeds back the deposition rate to the power supply 51 of the electron gun 5 so that a desired deposition rate is achieved. Of course, the control device 8 may control the rotational drive of the base material transport device 3 so that the final thickness is a desired thickness.

(Shutter)

The vacuum deposition apparatus 1 further includes a shutter 7 which can be retracted from and advanced to the space between the long strip base material 10 and the crucible 4. The shutter 7 at the retracted position allows evaporated particles of the evaporation material 11 to reach the long strip base material 10. The shutter 7 at the advanced position interrupts the space between the long strip base material 10 and the crucible 4 to inhibit the adhesion of the evaporated particles of the evaporation material 11 to the base material 10. Therefore, in the pre-heating step before the start of the deposition work, the shutter 7 is positioned at the advanced position, for preventing the adhesion of the evaporation material 11 to the long strip base material 10. At the start of the deposition work, the base material transport device 3 is driven, and the shutter 7 is positioned at the retracted position, for starting the deposition work. For example, the shutter 7 is retracted and advanced by an actuator (not shown). The control device 8 can control the back-and-forth movement of the shutter 7 by controlling the actuator. Also, the shutter 7 is preferably disposed near the crucible 4. The shutter 7 is preferably composed of a material which little reacts with the evaporation material 11 and has heat resistance, for example, stainless steel, carbon, or the like.

(Storage Device)

Figure 3A:
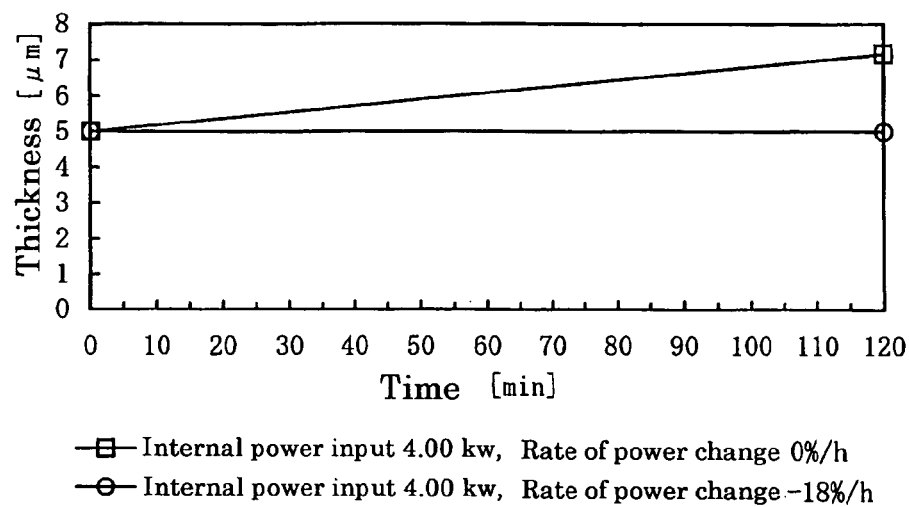
FIG. 3A is a graph showing the relation between the thickness and the elapsed time from the start of a deposition work using a vacuum deposition apparatus of the invention in which the power supply output of an electron gun was changed at a constant rate.
Figure 3B:
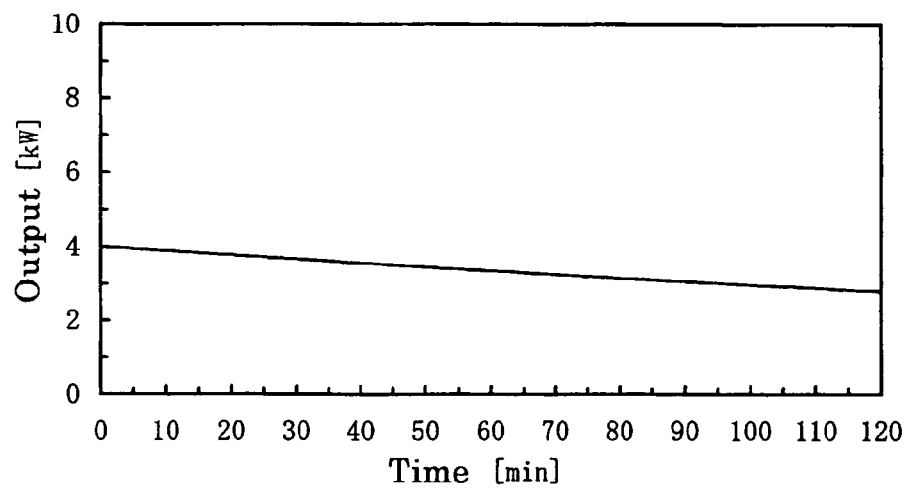
FIG. 3B is a graph showing the relation between the power supply output of an electron gun and the elapsed time from the start of a deposition work using a vacuum deposition apparatus of the invention at a constant deposition rate.

The storage device 9 will be described. In a preliminary experimental deposition work on the long strip base material 10, a rate of change in electric power from the initial power input is determined so that the thickness is uniform in the longitudinal direction of the base material. The initial power input is the electric power of the power supply 51 at the start of the deposition work, and the initial power input is controlled so that the deposition rate detected by the crystal oscillator thickness gauge 6 is equal to a desired value. A rate of change in electric power can be determined in the deposition work on the long strip base material 10 without monitoring the deposition rate. After the deposition work on the long strip base material 10, a thickness distribution in the longitudinal direction of the base material is measured to determine changes in thickness of a deposit from the start of the deposition work, and a rate of change in electric power from the initial power input may be determined so that a change in thickness of the deposit becomes zero. Therefore, the preliminary experiment need not be performed to deposit a film with a uniform thickness in the longitudinal direction of the long strip base material 10. Specifically, a deposition work is carried out at the constant initial power input under at least two levels of conditions realized by changing the rate of change in electric power. Under each level of condition, a deposit is sampled at a predetermined time interval (for example, 1 minute) from the start of the deposition work and analyzed by ICP (inductively coupled plasma emission spectroscopy). The thickness of each deposit is determined from the amount of the atoms actually deposited. FIG. 3A is a graph showing the relation between the thickness and the time from the start of a deposition work, which was determined by an experiment. Next, a rate of change in electric power per minute from the initial power input is determined by statistical operation (for example, multi-variate analysis) based on the graph so that a variation in thickness in the longitudinal direction of the base material is zero. Then, the time elapsed from the start of the deposition work and the output of the power supply 51 of the electron gun 5 determined from a rate of change in electric power are stored in the storage device 9. FIG. 3B is a graph showing the relation between the output and the time elapsed from the start of a deposition work, which was determined by an experiment.

(Control Device)

The control device 8 of the vacuum deposition apparatus 1 controls the drive of the base material transport device 3 and the output of the power supply 51 of the electron gun 5. In particular, the control device 8 preferably includes a first heating control part for controlling the output of the power supply 51 in the pre-heating step, a second heating control part for controlling the output of the power supply 51 during a deposition work, and a transport control part for driving the base material transport device 3 and to start the deposition work. The control device 8 includes a computer and is connected to the base material transport device 3, the shutter 7, the crystal oscillator thickness gauge 6, the power supply 51, and the storage device 9 through cables or wirelessly.

<Deposition Work Using Apparatus of the Invention>

A deposition work with the vacuum deposition apparatus 1 will be described in detail below.

(a) Pre-Heating Step

In the pre-heating step before the start of the deposition work, the output of the power supply 51 is controlled by the first heating control part so that the deposition rate is stabilized at a desired value. In addition, the output of the power supply 51 is made equal to the initial power input in the experiment. In this step, the deposition rate is monitored by the crystal oscillator thickness gauge 6.

Also, the shutter 7 is moved to the advanced position so as to inhibit the deposition of evaporated particles of the evaporation material 11 to the long strip base material 10.

(b) Step of Starting Deposition Work

After the desired deposition rate is stably achieved in the pre-heating step, the base material transport device 3 is driven by the transport control part to start the deposition work on the long strip base material 10. The transport speed of the long strip base material 10 during the deposition work is equal to the transport speed in the experiment. Therefore, the transport speed in the experiment may be stored in the storage device 9 so that the rotational drive of the base material transport device 3 is automatically controlled by the control device 8.

The control device 8 includes a shutter control part for retracting and advancing the shutter 7. At the same time as the drive of the base material transport device 3, the shutter 7 is moved to the retracted position to start the deposition work.

(c) Deposition Work Step

After the deposition work is started, the output (emission current) of the power supply 51 is controlled by the second heating control part so that the output coincides with the output of the elapsed time from the start of the deposition work stored in the storage device 9 as shown in FIG. 3B. After the deposition work is started, the deposition rate is not monitored with the crystal oscillator thickness gauge 6.

As described above, the deposition rate is monitored only in the pre-heating step before the deposition work, not monitored during the deposition work. Therefore, during the deposition work, it is preferable to prevent the deposition of the evaporation material 11 on the crystal oscillator sensor 61. For example, this can be achieved by integrally providing a shield 71 including a bended plate having a L-shaped sectional shape at the bottom of the plate-shaped shutter 7, as shown in FIG. 4A. In this case, when the shutter 7 is moved to the advanced position in the pre-heating step, the evaporated particles of the evaporation material 11 reach the crystal oscillator sensor 61 to permit monitoring of the deposition rate. When the shutter 7 is positioned at the retracted position at the start of the deposition work (shown by a two-dot chain line), the shield 71 covers the crystal oscillator sensor 61 and prevents the deposition of the evaporation material 11 on the crystal oscillator sensor 61, and the evaporation material 11 can be deposited on the long strip base material 10. Alternatively, as shown in FIG. 4B, the crystal oscillator sensor 61 may be integrally provided on the plate-shaped shutter 7. In this case, a plate-shaped fixed shield 72 which horizontally projects is provided in the vacuum chamber 2, and a movable shield 73 including a vertical piece is provided integrally at the bottom of the shutter 7. In this constitution, when the shutter 7 is moved to the advanced position in the pre-heating step, the evaporation material 11 reaches the crystal oscillator sensor 61 to permit monitoring of the deposition rate. When the shutter 7 is positioned at the retracted position at the start of the deposition work (shown by a two-dot chain line), the crystal oscillator sensor 61 is retracted in the space surrounded by the shutter 7, the fixed shield 72, and the movable shield 73, thereby preventing the deposition of the evaporation material 11 on the crystal oscillator sensor 61. Also, when the shutter 7 is positioned at the retracted position, the evaporation material 11 can be deposited on the long strip base material 10. Of course, the shutter and the shield may be separately provided so that the back-and-forth movements thereof are separately controlled by, for example, an actuator or the like.

<Deposition Work by Operating Method of the Invention>

The operating method of the invention will be described.

In the pre-heating step before the start of the deposition work, first, the output of the power supply 51 of the electron gun 5 is controlled to stabilize the deposition rate at a desired value. The deposition rate is monitored by the crystal oscillator thickness gauge 6, and the output of the power supply 51 is controlled to equal to the initial power input in the experiment. The shutter 7 is moved to the advanced position to prevent the adhesion of the evaporated particles of the evaporation material 11 to the long strip base material 10.

Next, after the deposition rate is stabilized at a desired value, the base material transport device 3 is driven to start the deposition work on the long strip base material 10. During the deposition work, the transport speed of the long strip base material 10 is the same as that in the experiment. Therefore, the transport speed of the long strip base material 10 in the experiment may be stored in the storage device 9 so that the rotational drive of the base material transport device 3 is automatically controlled by the control device 8. Furthermore, the shutter 7 is moved to the retracted position at the same time as the drive of the base material transport device 3 to start the deposition work.

After the deposition work is started, the output (emission current) of the power supply 51 is controlled to coincide with the output at the elapsed time from the start of the deposition work stored in the storage device 9 as shown in FIG. 3B, and the deposition work is performed. After the start of the deposition work, the deposition rate is not monitored with the crystal oscillator thickness gauge 6.

The above-described operating method and apparatus are capable of depositing a film with a uniform thickness on the long strip base material 10 in the longitudinal direction thereof. An example of the invention will be described below.

Example 1

Deposition Test

A deposition work was carried out to deposit a silicon thin film on a copper foil used as the long strip base material 10 using the vacuum deposition apparatus 1 of the invention shown in FIG. 1 and silicon (Si) as the evaporation material 11. The degree of vacuum in the vacuum chamber 2 was $2 \times 10^{-3}$ Pa or less, the deposition rate was 100 nm/sec, and the thickness was 5 µm. In addition, the initial power input of an electron gun at the start of the deposition work was 4.00 kW. Because of a high deposition rate, a rotary sensor using six crystal oscillators was used as the crystal oscillator sensor 6 of the crystal oscillator thickness gauge 6.

After the start of the deposition work, the output of the power supply 51 of the electron gun 5 was controlled by the control device 8 according to the relation between the output and the elapsed time from the start of the deposition work stored in the storage device 9 as shown in FIG. 3B. However, the previously formed output curve shown in FIG. 3B could be approximated to, for example, a curve in which the output decreases by 0.3% per minute of the elapsed time. Therefore, in the actual deposition work, a signal was sent to the power supply 51 from the control device 8 so as to decrease the output by 0.3% per minute, for controlling the output (emission current) of the power supply 51.

Test Result

As a result of deposition of a silicon thin film on the copper foil over a long time of 2 hours from the start of the deposition work, variation in thickness of the silicon thin film in the longitudinal direction was within ±8.0%. The result confirms that in deposition on a long strip base material using the apparatus of the invention, a high-quality film can be formed with a uniform thickness in the longitudinal direction.

The operating method and apparatus of the invention can be preferably applied to deposition of a film with a uniform thickness on a long strip base material in the longitudinal direction thereof. In particular, the operating method and apparatus can be preferably used for deposition of a film on a long strip base material for 3 minutes or more at a deposition rate of 100 nm/sec.

What is claimed is:

1. A method for operating a vacuum deposition apparatus in which in a vacuum chamber, an evaporation material is evaporated by heating with a heating device to deposit the evaporation material and form a film on a surface of a strip base material continuously run by a base material transport device, the method comprising:

providing a detection device for monitoring a deposition rate and a film thickness, a control device for controlling the base material transport device and the heating device, a storage device, and a shutter located between the strip base material and a source of the evaporation material;

measuring an elapsed time from a start of a first deposition work and an output of the heating device at the elapsed time in an experiment of depositing a film with a uniform thickness on the strip base material in a longitudinal direction thereof, and storing a resulting relation between the elapsed time and output in the storage device;

controlling an output of the heating device to a desired value on a basis of a detection result of the detection device in a pre-heating step for stabilizing the deposition rate before the start of the deposition work;

driving the base material transport device to start the deposition work on the strip base material after the deposition rate is controlled to a desired value;

controlling the output of the heating device by using the resulting relation between the elapsed time and output stored in the storage device after the start of the deposition work; and controlling the shutter so that it is advanced into and retracted from a space between the strip base material and the source of evaporation material, wherein in an advanced position, the shutter interrupts the space between the strip base material and the source of evaporation material to inhibit the adhesion of the evaporation material on the strip base material; and that at the start of the deposition work, the shutter is positioned at a retracted position at the same time as the drive of the base material transport device to start the deposition work on the strip base material, and the shutter inhibits the adhesion of the evaporation material on the detection device, and wherein when the shutter is positioned at a retracted position the shutter interrupts a space between the detection device and the source of the evaporation material.

2. The method according to claim 1, wherein the detection device uses a method for monitoring the deposition rate and the film thickness by detecting a change in oscillation frequency of a crystal oscillator.

* * * * *